United States Patent
Yoo et al.

(10) Patent No.: US 6,486,039 B2
(45) Date of Patent: Nov. 26, 2002

(54) METHOD OF FABRICATING A TRENCH ISOLATION STRUCTURE HAVING SIDEWALL OXIDE LAYERS WITH DIFFERENT THICKNESSES

(75) Inventors: Jae-yoon Yoo, Seoul (KR); Jeong-soo Lee, Yongin (KR); Nae-in Lee, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/933,039

(22) Filed: Aug. 21, 2001

(65) Prior Publication Data

US 2002/0086495 A1 Jul. 4, 2002

(30) Foreign Application Priority Data

Dec. 28, 2000 (KR) .............................. 00-84160

(51) Int. Cl.[7] ............................. H01L 21/302
(52) U.S. Cl. ................ 438/425; 438/427; 438/433; 438/704; 438/696; 438/717; 438/723; 438/724; 438/719
(58) Field of Search ................ 438/704, 692, 438/696, 701, 717, 723, 724, 740, 743, 744, 756, 757, 435, 425, 427, 430, 433, 719

(56) References Cited

U.S. PATENT DOCUMENTS 5,811,347 A * 9/1998 Gardner et al. ............. 438/435
6,284,626 B1 * 9/2001 Kim ........................... 438/433
6,323,106 B1 * 11/2001 Huang et al. ............... 438/433

* cited by examiner

*Primary Examiner*—George Goudreau
(74) *Attorney, Agent, or Firm*—Lee & Sterba, P.C.

(57) ABSTRACT

A method of fabricating a trench isolation structure in a high-density semiconductor device that provides an isolation characteristic that is independent of the properties of adjacent MOS transistor devices, wherein a first trench in a first isolation area and a second trench implanted are formed on a semiconductor substrate, a nitrogen (N)-rich silicon layer is formed on the sidewall in a second isolation area, a subsequent oxidation process may be employed to fabricate oxide layers, each having a different thickness, on the sidewall surfaces of the first and second trenches. When the first and second oxide-layered trenches are filled with a stress relief liner and a dielectric material, the different thicknesses of the oxides prevent leakage currents from flowing to an adjacent semiconductor device, regardless of the doping properties of each device.

16 Claims, 6 Drawing Sheets

METHOD OF FABRICATING A TRENCH ISOLATION STRUCTURE HAVING SIDEWALL OXIDE LAYERS WITH DIFFERENT THICKNESSES

BACKGROUND OF THE INVENTION

1. Field of the Invention

The present invention relates to a method of fabricating an isolation structure of a semiconductor device. More particularly, the present invention relates to a method of fabricating a trench isolation structure having sidewall oxide layers, each of a different thickness.

2. Description of the Related Art

As semiconductor devices become more highly integrated, isolation technologies for electrically isolating adjacent transistors become increasingly more important. Since conventional local oxidation of silicon (LOCOS) processes are not appropriate for semiconductor devices having a fine design rule of 0.5 $\mu$m or less, trench isolation techniques are widely used to provide the necessary electrical isolation. In a typical trench isolation application, a trench is formed by etching an isolation area of a semiconductor substrate and then filled with a dielectric material to form an isolation layer.

A disadvantage of conventional trench isolation technology is that silicon lattice defects and damage may occur on an inner surface of the trench during a conventional dry etching process used in the forming of the trench. To reduce such silicon lattice defects and damage, a method can be used that forms a sidewall oxide layer by thermally oxidizing the inner surface of the trench. However, since the presence of the oxide layer can generate stress due to differences in thermal expansion coefficients between silicon oxide layers, a nitride liner is often deposited between a trench sidewall oxide layer and a silicon oxide layer. Such a nitride liner has an effect of improving the refresh characteristics of N-channel MOS transistors in dynamic random access memory (DRAM) devices, for example.

However, when the above process is used in the fabrication of a P-channel channel MOS transistor, hot electrons may be trapped in the nitride liner, thus deteriorating the electrical characteristics of the P-channel MOS transistor. In other words, hot electrons are generated due to an impact ionization and then are trapped in the nitride liner. Such hot electrons can create several problems, one of which is a formation of an abnormal conduction path to any device that is adjacent to the P-channel MOS transistor. This abnormal conduction path, which results from a particular distribution of electrical holes in the trench area, increases leakage current flowing between impurity areas of the two devices. Additionally, due to the hole accumulation around the trench, an effective channel length becomes shorter in any P-channel MOS transistor which is adjacent to the trench. As a result, a short-channel effect is increased, and the electrical characteristics of the P-channel transistor deteriorate.

The above electron/hole problems do not occur in an adjacent N-channel transistor, since it has an opposite conduction property. Specifically, any holes accumulating around the trench serve as an isolation area, and a majority of carriers are electrons. Thus, the effective channel length is not reduced in the N-channel MOS transistor.

In order to solve the above problems of the P-channel MOS transistor, a method of forming a thick sidewall oxide layer has been proposed. Specifically, a thick sidewall oxide layer may reduce the density of electrons trapped in a nitride liner. In the meantime, in the case of N-channel MOS transistors, a thick sidewall oxide layer deteriorates the refresh characteristics of the N-channel MOS transistors. Consequently, in a case where complementary-type MOS transistors, i.e., N-channel MOS transistors and P-channel MOS transistors, are formed in a substrate, the thickness of a sidewall oxide layer in the N-channel MOS transistor should be different from the thickness of a sidewall oxide layer in the P-channel MOS transistor.

SUMMARY OF THE INVENTION

It is a feature of an embodiment of the present invention to provide a method of forming a trench isolation structure having sidewall oxide layers each of different a thickness in an isolation area of an N-channel MOS transistor and in an isolation area of a P-channel MOS transistor to prevent holes from accumulating around a trench isolation area of the P-channel MOS transistor of complementary MOS transistors.

Accordingly, to provide the above feature, there is provided a method of fabricating a trench isolation structure, wherein a first trench in a first isolation area is separated from a second trench in a second isolation area, both trenches being included on a common semiconductor substrate, comprising: forming the first and second trenches; forming a nitrogen (N)-rich silicon layer on the sidewall surface of the second trench by implanting nitrogen into the second trench; forming an oxide layer having a first thickness on the sidewalls of the first trench and a having a second thickness on the sidewalls of the second trench via an oxidation process; forming a stress relief liner on the oxide layers of the first and second trenches; and filling the first and second trenches with a dielectric material.

Preferably, the formation of the first and second trenches includes: forming an etch stopping layer pattern on the semiconductor substrate to expose the first and second isolation areas; and forming the first and second trenches by etching the semiconductor substrate in the first and second isolation areas using the etch stopping layer pattern as an etch mask. The etch stopping layer pattern may be a stack layer pattern of a pad oxide layer and a silicon nitride layer. Preferably, the formation of a nitrogen (N)-rich silicon layer on the sidewall of the second trench includes: forming a mask layer pattern for exposing the second trench while covering the first trench; implanting nitrogen into the exposed second trench using the mask layer pattern as an implantation mask to form the nitrogen (N)-rich silicon layer; and removing the mask layer pattern. The mask layer pattern may be a photoresist layer. Implanting nitrogen into the second trench may be performed by an ion implantation process. Preferably, implantation energy and dosage in the ion implantation process are determined by the desired second thickness of the sidewall oxide layer of the second trench. Implanting nitrogen into the second trench may also be performed by a plasma nitridation process. It is preferable that the first isolation area delimits the P-channel channel MOS transistor area and the second isolation area delimits the N-channel channel MOS transistor area. The first thickness of the first sidewall oxide layer is preferably 100 to 300 Å. The second thickness of the second sidewall oxide layer is preferably 20 to 100 Å. The oxidation process for forming the first and second sidewall oxide layers is preferably a thermal oxidation process. The stress relief liner is preferably a nitride liner.

These and other features of the present invention will be readily apparent to those of ordinary skill in the art upon review of the detailed description that follows.

BRIEF DESCRIPTION OF THE DRAWINGS

The above feature and advantages of the present invention will become more apparent by describing in detail a preferred embodiment thereof with reference to the attached drawings in which.

DETAILED DESCRIPTION OF THE PREFERRED EMBODIMENTS

Korean Patent Application No.00-84160, filed on Dec. 28, 2000, and entitled: "Method of Fabricating Trench Isolation Structure Having Sidewall Oxide Layers with Different Thicknesses," is incorporated by reference herein in its entirety.

Hereinafter, a preferred embodiment of the present invention will be described in detail with reference to the attached drawings. However, the embodiment of the present invention can be modified into various other forms, and the scope of the present invention must not be interpreted as being restricted to the embodiment.

The embodiment is provided to more completely explain the present invention to those skilled in the art. In the drawings, the thicknesses of layers or regions are exaggerated for clarity. In the drawings, like reference numerals denote like elements. Also, when it is written that a layer is formed "on" another layer or a substrate, the layer can be formed directly on the other layer or the substrate, or other layers can intervene therebetween.

In order to solve the problems of the leakage current paths associated with a P-channel MOS transistor, a thick sidewall oxide layer of an isolation trench can be implemented which will reduce the density of electrons trapped in a nitride liner. However, since a thick sidewall oxide layer deteriorates refresh characteristics of an N-channel MOS transistor, a second isolation trench incorporating a thinner sidewall oxide layer may be used for the N-channel MOS transistor. Thus, according to an embodiment of the present invention, a pair of isolation trenches can be simultaneously fabricated with each having a different sidewall oxide layer thickness.

FIGS. 1 through 4 illustrate cross-sectional views of an exemplary trench isolation structure fabricated according to an embodiment of the present invention.

Figure 1:
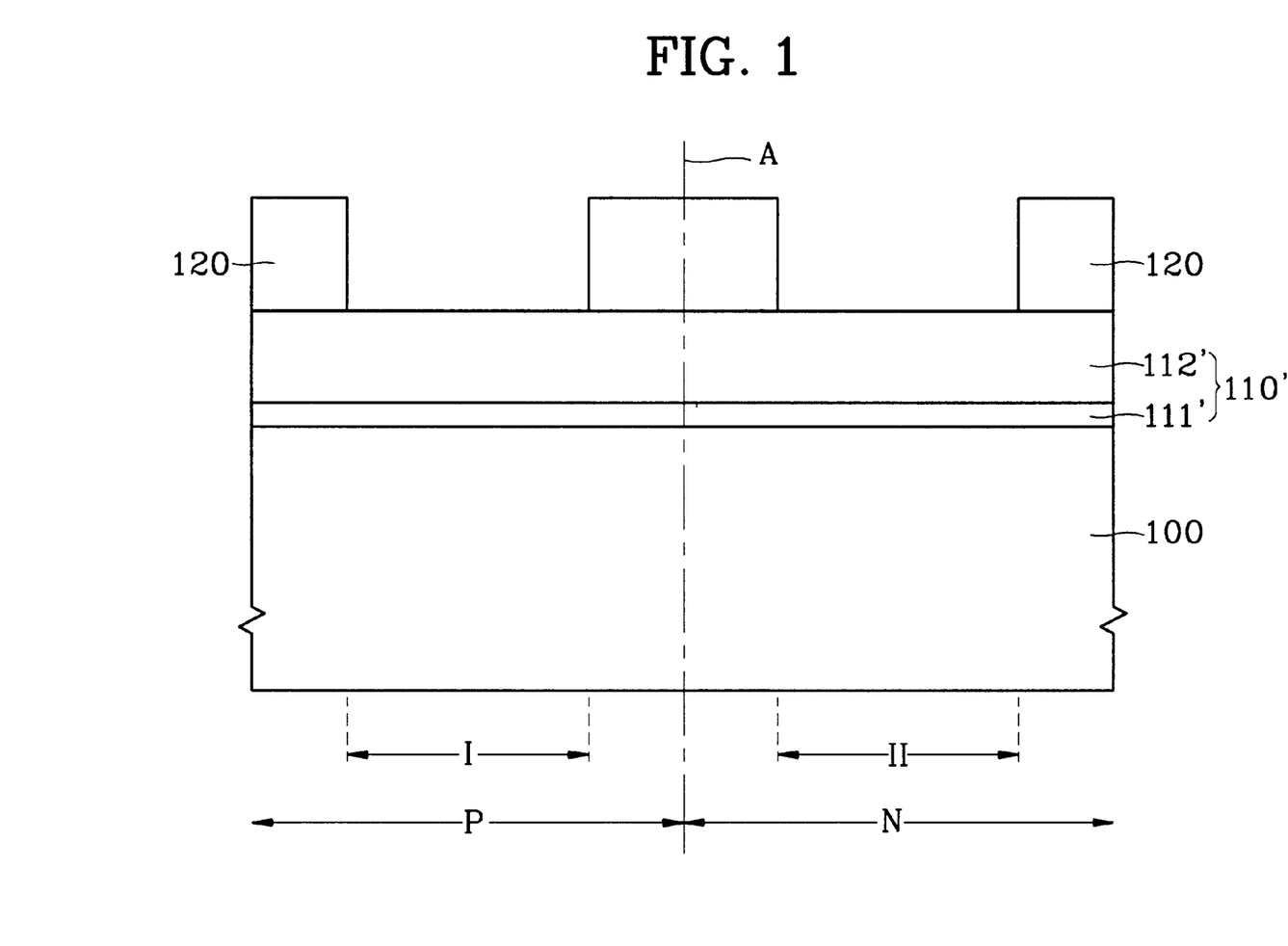
FIGS. 1 through 5 illustrate cross-sectional views of a trench isolation structure being fabricated in accordance with an embodiment of the present invention.

Referring to FIG. 1, an etch stopping layer 110' can be preferably formed on a semiconductor substrate 100 having a first isolation area I and a second isolation area II. The first isolation area I is in a P-channel MOS transistor P and the second isolation area II is in an N-channel MOS transistor N. In FIG. 1, the P-channel channel MOS transistor is located to the left of the line A and the N-channel MOS transistor is located to the right of the line A.

The etch stopping layer 110' can be a stack layer comprised of a pad oxide layer 111' and a silicon nitride layer 112'. Mask layer patterns 120 can be formed on the areas of etch stopping layer 110' to be patterned. The mask layer pattern 120 is preferably a photoresist layer made by photo exposure and development processes using a common photolithographic method. The mask layer pattern 120 may be a stack layer comprised of a photoresist layer pattern, a silicon oxide ($SiO_2$) layer, and a nitride layer. An aluminum oxide ($Al_2O_3$) layer may also be substituted for the $SiO_2$ layer. Using these layers, a high resolution pattern can be easily formed and the photoresist layer can be protected from contamination during a subsequent dry etch process. Mask layer patterns 120 would preferably have openings for exposing the surface of the semiconductor substrate 100 in the first and second isolation areas I and II.

Figure 2:
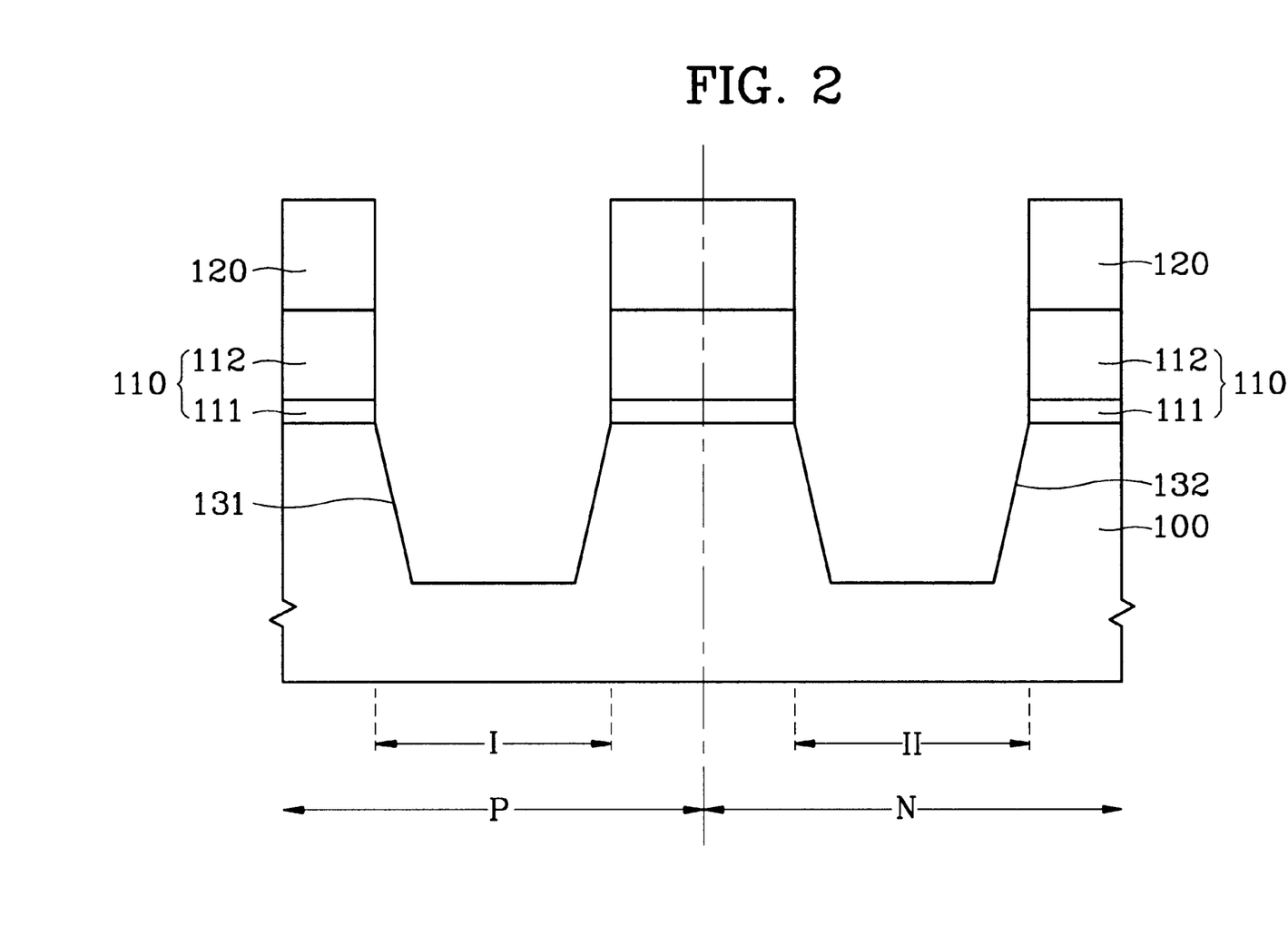

With reference to FIG. 2, etch stopping layer patterns 110 can be formed by etching the silicon nitride layer 112' of FIG. 1 and the pad oxide layer 111' of FIG. 1 in sequence using the mask layer patterns 120 as etching masks. Due to this patterning process, etch stopping layer patterns 110 may have structures wherein the pad oxide layer patterns 111 and the silicon nitride layer patterns 112 are stacked. A first trench 131 and a second trench 132 may be formed by etching the exposed surface of the semiconductor substrate 100 to a predetermined depth, e.g., to a depth of about 0.1 to 1.5 $\mu$m using the mask layer patterns 120 and the etch stopping layer patterns 110 as etch masks. First trench 131 is formed in the first isolation area I and second trench 132 is formed in the second isolation area II.

Figure 3:
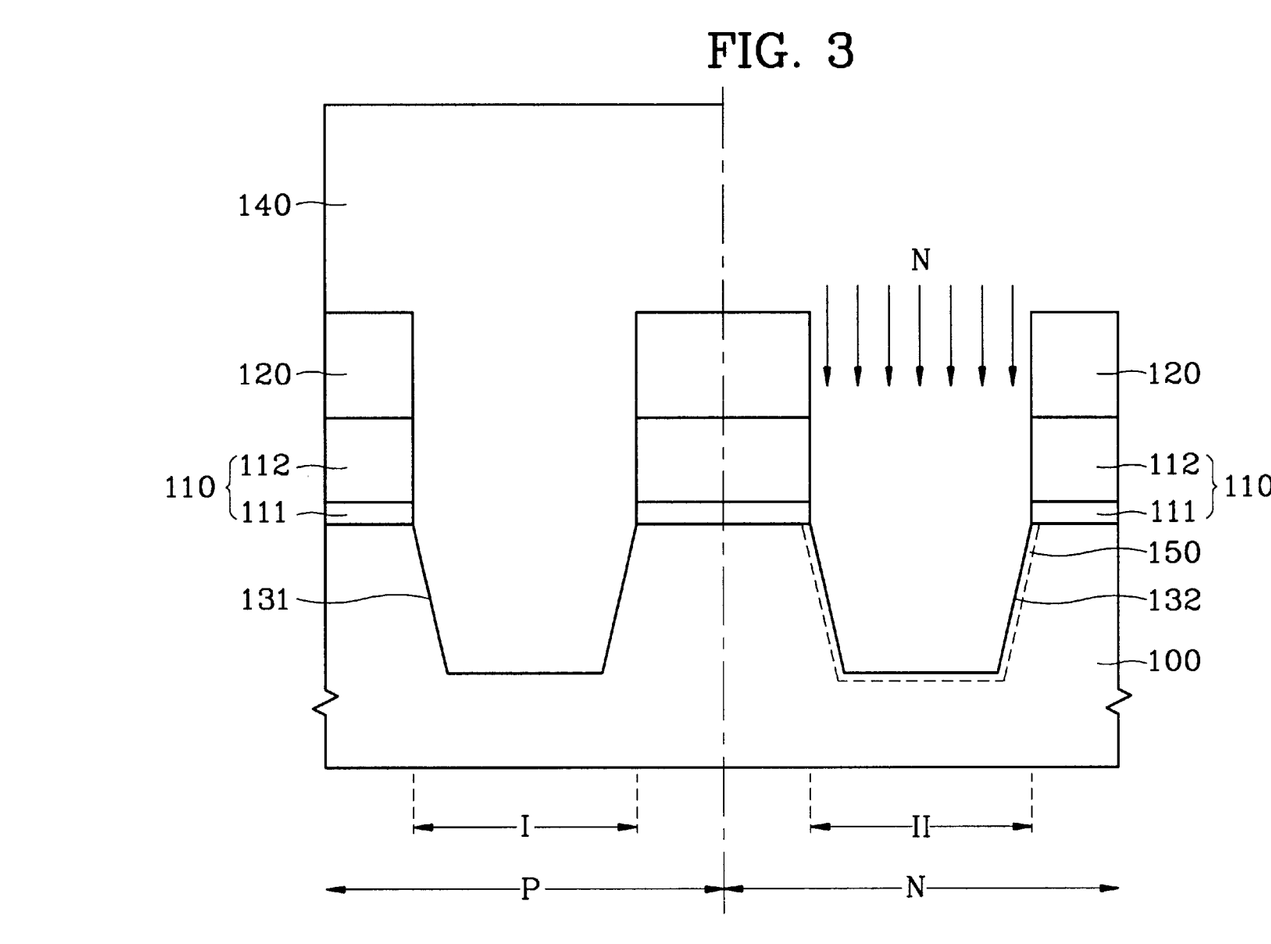

Referring to FIG. 3, the N-channel MOS transistor area N is exposed and the P-channel MOS transistor area P is covered with a mask layer pattern 140. The mask layer pattern 140 is preferably a photoresist layer made by photo exposure and development processes using a common photolithographic method. A silicon oxide ($SiO_2$) layer, an aluminum oxide ($Al_2O_3$) layer or a silicon on glass (SOG)-based material layer may be used as the mask layer pattern 140. Only the surface of the second trench 132 formed in the second isolation area II of the N-channel MOS transistor area N is exposed due to the formation of the mask layer pattern 140. In other words, the P-channel MOS transistor area P is completely covered with the mask layer 140 and an active area of the N-channel channel MOS transistor area N, i.e., the semiconductor substrate 100, is exposed except for the areas where the second isolation area II is covered with the etch stopping layer pattern 110 and the mask layer pattern 120.

A nitrogen (N)-rich silicon layer 150 is then formed on the outer surface of the second trench 132 by implanting nitrogen into the exposed surface of the second trench 132. The nitrogen implantation may be performed by an ion implantation process using an ion implantation apparatus or a plasma nitridation process using a plasma nitridation apparatus.

When the ion implantation process is used, the implantation energy and dosage may be determined by a consideration of the desired nitrogen content in the resulting N-rich silicon layer 150. It is preferable that an exemplary implantation energy be 1 to 30 KeV and an exemplary dosage be $1 \times 10^{14}$–$5 \times 10^{15}$/cm2, but not limited thereto.

Alternatively, a plasma nitridation process can be used whereby the nitrogen is implanted using plasma and a chemical reaction. For such a plasma nitridation process, a variety of N-rich gases such as $N_2$, $NH_3$, NO, or $N_2$ can be used as chemical reaction gases. Preferably, Helium (He) is used as a carrier gas, although other carrier gases may also be used. Use of the plasma nitridation process implants nitrogen more uniformly into the sidewall of a trench than the alternative processes, and is thus preferable. A radio frequency (RF) plasma nitridation process, a high-density plasma nitridation process, or a microwave plasma nitridation process can also be used as the plasma nitridation process depending on the source used for forming the plasma. Also, a remote plasma nitridation (RPN) process wherein a plasma generation apparatus is separated from a reaction chamber at regular intervals based on the position thereof can be used.

The thickness and nitrogen content of the resulting N-rich silicon layer 150 is dependent on the operating parameters used in the reaction chamber. For example, a given pressure, power, temperature, and time in the reaction chamber of the plasma nitridation apparatus produces a unique-thickness N-rich silicon layer 150. The unique-thickness N-rich silicon layer 150 in turn determines the growth rate of an oxide that is to be deposited in subsequent processing. In other words, for a rich nitrogen content in the N-rich silicon layer 150, growth of a sidewall oxide layer is limited in the subsequent process. Thus, a resulting difference in the oxide growth rates on the first trench 131 having no N-rich silicon layer and the second trench 132 that results from the nitridation processing on second trench 132 produces oxide layers each having a different thickness on the two trenches during a single oxidation process.

Figure 4:
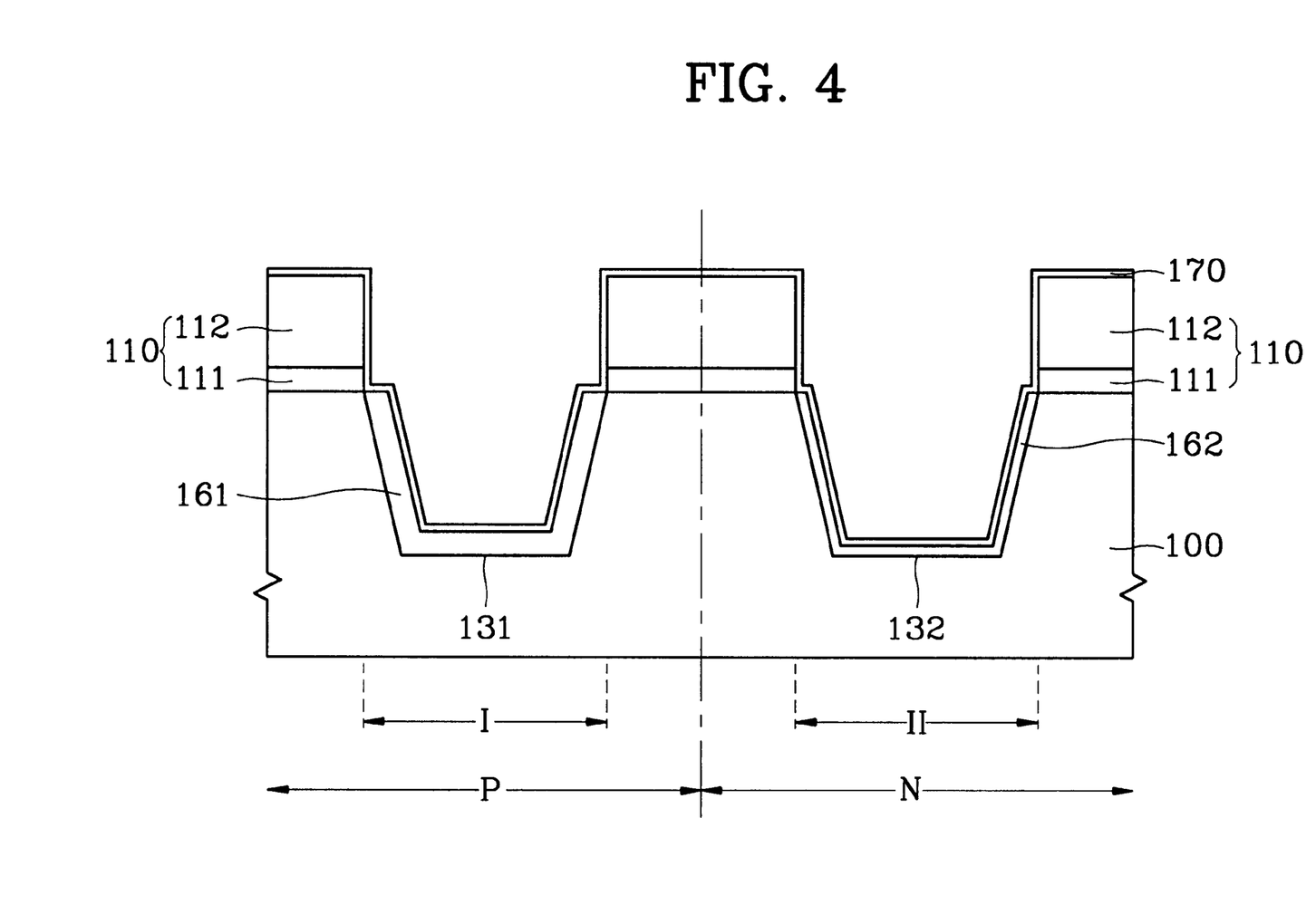

With reference to FIG. 4, a first sidewall oxide layer 161 having a first thickness and a second sidewall oxide layer 162 having a second thickness may be formed on the surfaces of the first and second trenches 131 and 132, respectively, by an oxidation process, such as, but not limited to, a thermal oxidation process. It is preferable that the first thickness of the first sidewall oxide layer 161 is approximately 100 to 300 Å and the second thickness of the second sidewall oxide layer 162 is approximately 20 to 100 Å. In this embodiment, the second thickness of the second sidewall oxide layer 162 is less than the first thickness of the first sidewall oxide layer 161 due to the N-rich silicon layer 150 implanted on the surface of the second trench 132. In other words, the nitrogen component contained in the N-rich silicon layer 150 limits the growth rate of the second sidewall oxide layer 162, thereby producing the thinner second sidewall oxide layer 162 relative to the first sidewall oxide layer 161.

After the first and second sidewall oxide layers 161 and 162 each having a different thickness are formed, mask layer patterns 120 of FIG. 3 and 140 of FIG. 3 are removed, and a stress relief liner 170 is formed on the entire resultant. The stress relief liner 170 relieves stresses that are due to a difference in thermal expansion coefficients between the semiconductor silicon substrate 100 and silicon oxide layers filling the first and second trenches 131 and 132 during the subsequent thermal oxidation process. Thus, it is preferable that the stress relief liner 170 be thin enough to provide a relief effect and be formed of silicon nitride ($Si_xN_y$) or silicon nitride oxide (SiON).

Figure 5:
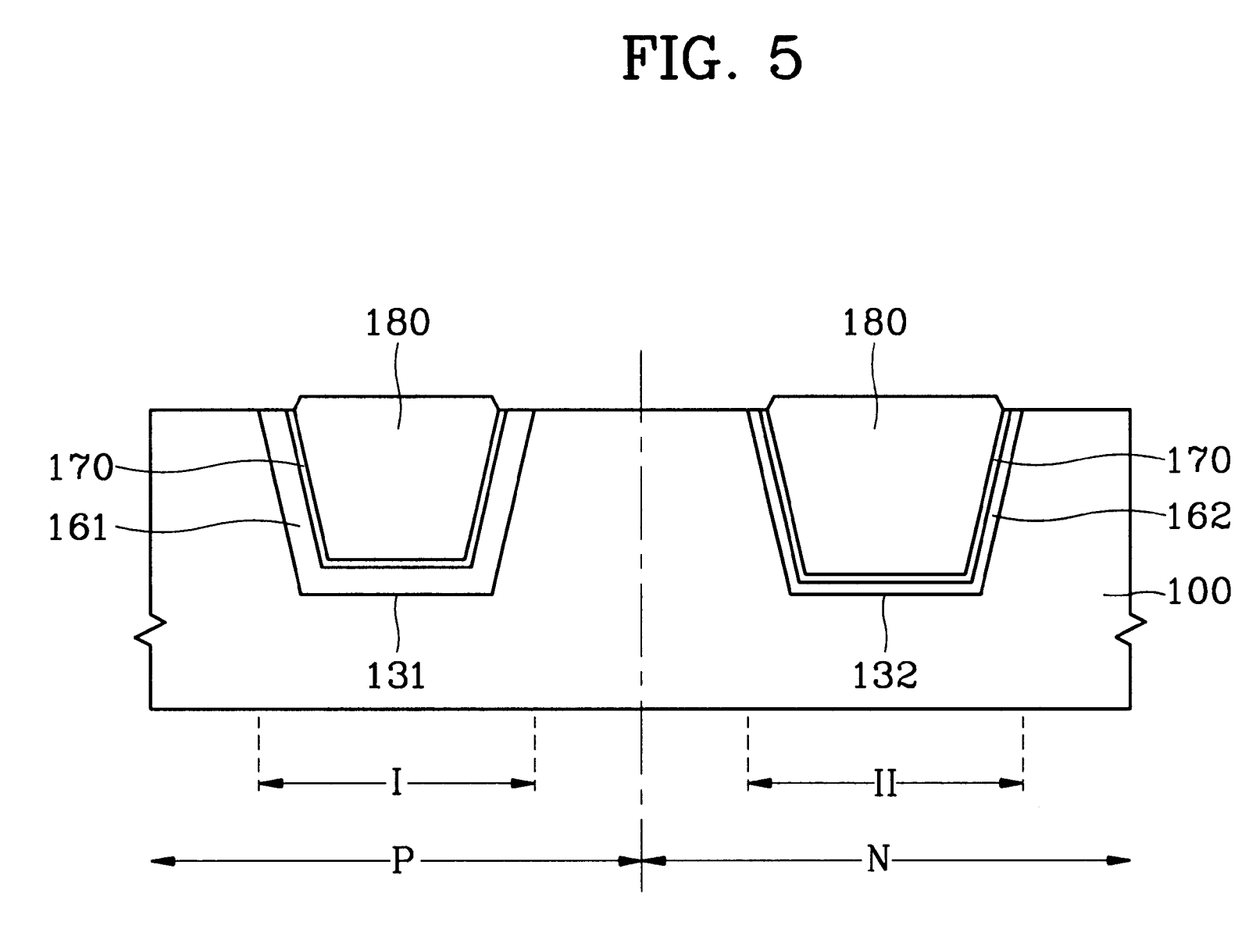

Referring to FIG. 5, a dielectric material layer 180 having an excellent filling property for filling a trench, e.g., a high-density plasma oxide layer, is deposited to completely fill the first and second trenches 131 and 132. The dielectric material layer 180, the stress relief liner 170, and the etch stopping layer patterns 110 are then planarized until the surface of the semiconductor substrate 100 is exposed. The planarization process can be performed by a chemical mechanical polishing (CMP) method. After the planarization process, trench isolation structures having the sidewall oxide layers 161 and 162, each of a different thickness, are thus completed in the first isolation area I and the second isolation area II, as shown.

Figure 6:
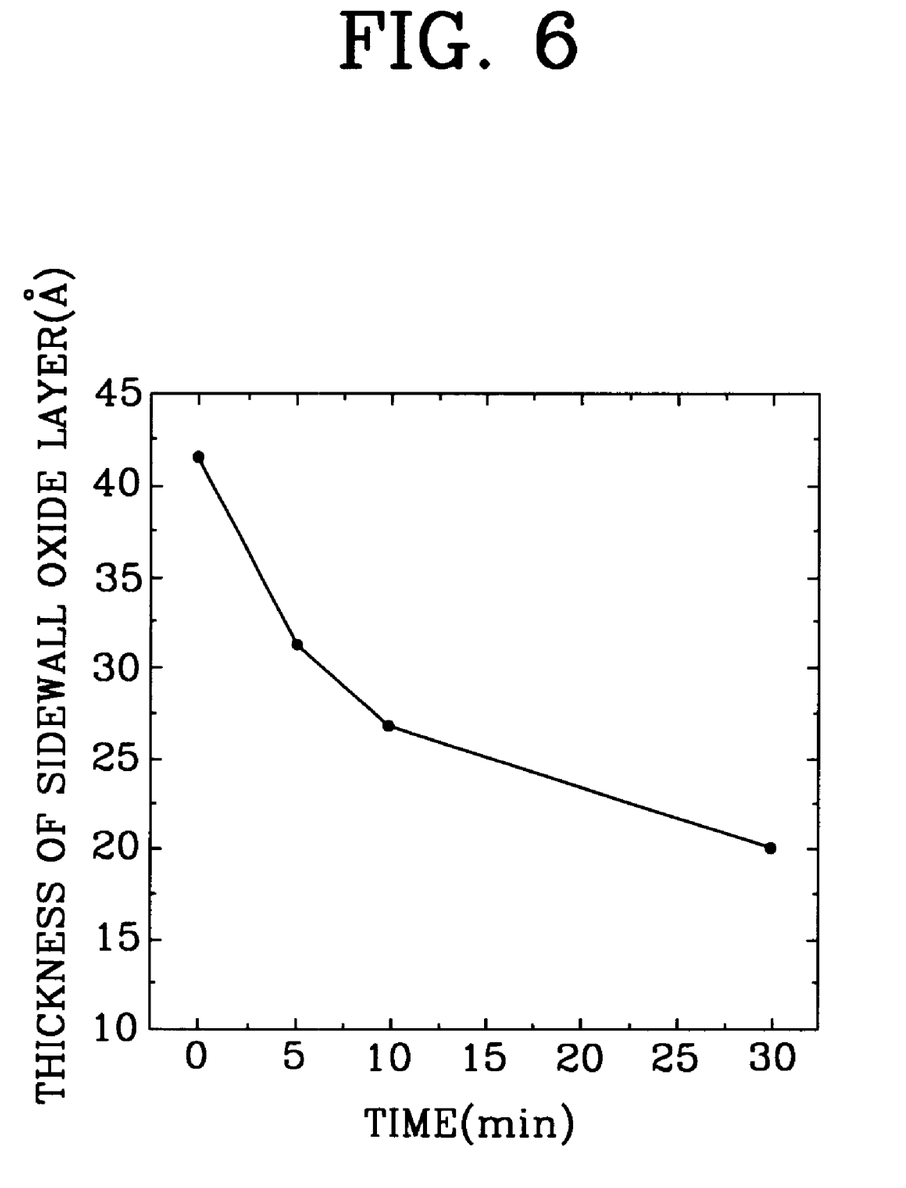
FIG. 6 illustrates a graph of the relationship between the time required for a remote plasma nitride process and the resulting thickness of a sidewall oxide layer according to an embodiment of the present invention.

FIG. 6 illustrates a graph of the relationship between the time required for a remote plasma nitridation process and the thickness of a sidewall oxide layer. In FIG. 6, the horizontal axis denotes the processing time (minutes) required for the remote plasma nitridation process and the vertical axis denotes the resulting thickness of the sidewall oxide layer (Å). The remote plasma nitridation process may be performed using a microwave power of 3000 W, 2.8 standard liters per minute (slm) of the carrier gas, 0.8 slm of $N_2$ reaction gas, at a pressure of 1.9 Torr, and temperature of 550° C. An SC-1 cleaning process is performed at 65° C. for 10 minutes after the remote plasma nitridation process. Next, the entire wafer substrate is submerged in a HF solution of 200:1 for 90 seconds and then the SC-1 cleaning process is repeated at 65° C. for 10 minutes.

As shown in FIG. 6, as the time for the remote plasma nitridation process increases, the thickness of the second sidewall oxide layer 162 decreases. Thus, the nitrogen content in the N-rich silicon layer 150 increases with an increase in the time for the remote plasma nitridation process. As a result, growth of the second sidewall oxide layer 162 is further limited and thus the thickness thereof is reduced.

As described above, in the method of fabricating a trench isolation structure according to the present invention, the N-rich silicon layer is formed on the surface of the trench in the N-channel MOS transistor area and simultaneously, the sidewall oxide layer is formed on the surface of the trench in the P-channel MOS transistor.

Therefore, trench isolations having sidewall oxide layers, each having a different thickness, are each formed in the isolation areas of the P-MOS and N-MOS transistor areas. Thus, the P-MOS transistor area having a relatively thick sidewall oxide layer is not gradually affected by electrons trapped in the stress relief liner and deterioration of electrical characteristics of devices can be prevented. Also, fine refresh characteristics can remain in the N-MOS transistor area having a relatively thin sidewall oxide layer.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A method of fabricating a trench isolation structure having at least two isolation trenches, comprising:
    (a) forming a first trench having two sidewalls in a first isolation area on a semiconductor substrate;
    (b) forming a second trench having two sidewalls in a second isolation area, the second isolation area being separated from the first isolation area;
    (c) forming a nitrogen (N)-rich silicon layer on the sidewall surfaces of the second trench by implanting nitrogen into the second trench;
    (d) forming, using an oxidation process, a first sidewall oxide layer having a first thickness in the first trench and a second sidewall oxide layer having a second thickness in the second trench;
    (e) forming a stress relief liner on the surfaces of the first and second sidewall oxide layers; and
    (f) filling the first and second trenches with a dielectric material.

2. The method of claim 1, wherein forming the first trench and the second trench further comprises:
    forming an etch stopping layer pattern on the semiconductor substrate to expose the first and second isolation areas; and forming the first and second trenches by etching the semiconductor substrate in the first and second isolation areas using the etch stopping layer pattern as an etch mask.

3. The method of claim 2, wherein the etch stopping layer pattern is a stack layer pattern of a pad oxide layer pattern and a silicon nitride layer pattern.

4. The method of claim 1, wherein forming a nitrogen (N)-rich silicon layer further comprises:

applying a mask layer pattern that exposes the second trench and covers the first trench;

implanting nitrogen into the exposed second trench using the mask layer pattern as an implantation mask to form the nitrogen (N)-rich silicon layer; and removing the mask layer pattern.

5. The method of claim 4, wherein the mask layer pattern is a photoresist layer.

6. The method of claim 1, wherein implanting nitrogen into the second trench is performed by an ion implantation process.

7. The method of claim 6, wherein implantation energy and dosage in the ion implantation process are determined by the intended second thickness of the second sidewall oxide layer.

8. The method of claim 1, wherein implanting nitrogen into the second trench is performed by a plasma nitridation process.

9. The method of claim 8, wherein a plurality of environmental conditions and a time in a reaction chamber under those conditions for the plasma nitridation process are determined by the intended second thickness of the second sidewall oxide layer.

10. The method of claim 9, wherein a plurality of environmental conditions comprise two or more from the group consisting of pressure, power, and temperature.

11. The method of claim 1, wherein the first isolation area delimits a P-channel MOS transistor area.

12. The method of claim 1, wherein the second isolation area delimits an N-channel MOS transistor area.

13. The method of claim 1, wherein the first thickness of the first sidewall oxide layer is approximately 100 to 300 Å.

14. The method of claim 1, wherein the second thickness of the second sidewall oxide layer is approximately 20 to 100 Å.

15. The method of claim 1, wherein the oxidation process for forming the first and second sidewall oxide layers is a thermal oxidation process.

16. The method of claim 1, wherein the stress relief liner is a nitride liner.

* * * * *